(12) United States Patent
Roman et al.

(10) Patent No.: US 11,072,161 B2
(45) Date of Patent: Jul. 27, 2021

(54) EXTRACTING 3D OBJECTS

(71) Applicant: HEWLETT-PACKARD DEVELOPMENT COMPANY, L.P., Houston, TX (US)

(72) Inventors: Justin M Roman, Vancouver, WA (US); Michael Duda, Vancouver, WA (US); Robert Beauchamp, Sant Cugat del Valles (ES); Wesley R Schalk, Vancouver, WA (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 232 days.

(21) Appl. No.: 16/075,094

(22) PCT Filed: Dec. 21, 2016

(86) PCT No.: PCT/US2016/067912
§ 371 (c)(1),
(2) Date: Aug. 2, 2018

(87) PCT Pub. No.: WO2018/118032
PCT Pub. Date: Jun. 28, 2018

(65) Prior Publication Data
US 2019/0039367 A1 Feb. 7, 2019

(51) Int. Cl.
*B33Y 30/00* (2015.01)
*B08B 7/02* (2006.01)
*B29C 64/35* (2017.01)
*B08B 5/04* (2006.01)
*B33Y 40/00* (2020.01)
*B29C 64/40* (2017.01)
*G06F 30/00* (2020.01)
*B33Y 10/00* (2015.01)
*B29C 64/153* (2017.01)

(52) U.S. Cl.
CPC ............... *B33Y 30/00* (2014.12); *B08B 5/04* (2013.01); *B08B 7/02* (2013.01); *B29C 64/153* (2017.08); *B29C 64/35* (2017.08); *B29C 64/40* (2017.08); *B33Y 10/00* (2014.12); *B33Y 40/00* (2014.12); *G06F 30/00* (2020.01)

(58) Field of Classification Search
CPC ......... B33Y 30/00; B33Y 10/00; B33Y 40/00; B08B 7/02
See application file for complete search history.

(56) References Cited

U.S. PATENT DOCUMENTS 6,932,935 B1 8/2005 Oberhofer et al.
8,827,681 B2 9/2014 Chen et al.
(Continued)

FOREIGN PATENT DOCUMENTS

CN 204035537 U 12/2014
CN 104275491 A 1/2015
(Continued)

*Primary Examiner* — Joseph S Del Sole
*Assistant Examiner* — Yung-Sheng M Tsui
(74) *Attorney, Agent, or Firm* — Dierker & Kavanaugh PC

(57) ABSTRACT

In an example implementation, a method of extracting three-dimensional (3D) objects includes forming on a vibratory extraction platform, a build cake comprising a fused 3D object encased within build material and vibrating the extraction platform to break apart the build material and sift it through openings in the extraction platform.

7 Claims, 2 Drawing Sheets

(56) References Cited

U.S. PATENT DOCUMENTS

| | | | |
|---|---|---|---|
| 10,377,061 B2* | 8/2019 | Wolfgang | B33Y 40/00 |
| 2001/0045678 A1* | 11/2001 | Kubo | B29C 64/35 |
| | | | 264/37.29 |
| 2004/0025905 A1 | 2/2004 | Ederer et al. | |
| 2004/0084814 A1 | 5/2004 | Boyd et al. | |
| 2007/0126157 A1 | 6/2007 | Bredt | |
| 2008/0241404 A1 | 10/2008 | Allaman et al. | |
| 2013/0244040 A1 | 9/2013 | Oshima | |
| 2015/0258744 A1 | 9/2015 | Muller et al. | |
| 2016/0207265 A1 | 7/2016 | Yoo et al. | |
| 2016/0279871 A1 | 9/2016 | Heugal et al. | |
| 2017/0165751 A1* | 6/2017 | Buller | B23K 26/1462 |
| 2018/0126620 A1* | 5/2018 | Talgorn | B29C 48/147 |
| 2019/0030796 A1* | 1/2019 | Oppenheimer | B33Y 10/00 |
| 2019/0176395 A1* | 6/2019 | Roman | B29C 64/25 |

FOREIGN PATENT DOCUMENTS

| | | |
|---|---|---|
| EP | 2892708 | 7/2015 |
| EP | 3383627 | 10/2018 |
| RU | 2535704 C1 | 12/2014 |
| SU | 863173 A1 | 9/1981 |
| SU | 1685599 A1 | 10/1991 |
| WO | 9534468 A1 | 12/1995 |
| WO | WO-2014039378 | 3/2014 |
| WO | WO-2017188967 | 11/2017 |

\* cited by examiner

EXTRACTING 3D OBJECTS

BACKGROUND

Additive manufacturing processes can produce three-dimensional (3D) objects by providing a layer-by-layer accumulation and solidification of build material patterned from a digital model. In some examples, layers of build material are processed using heat to cause melting and solidification of the material in selected regions of each layer. The selected regions comprise 2D cross-sectional areas that represent a 3D slice of an object being formed, or printed. In some examples, layers of build material can be preheated prior to the melting process. In some examples, the selected regions can be defined by depositing a fusing agent that helps to absorb heat to melt the material within the selected regions. In some examples, such additive manufacturing processes can result in a solidified 3D object encased within a block or "cake" of build material that can be bound together with varying degrees of firmness.

BRIEF DESCRIPTION OF THE DRAWINGS

Examples will now be described with reference to the accompanying drawings, in which.

Throughout the drawings, identical reference numbers designate similar, but not necessarily identical, elements.

DETAILED DESCRIPTION

Figure 1:
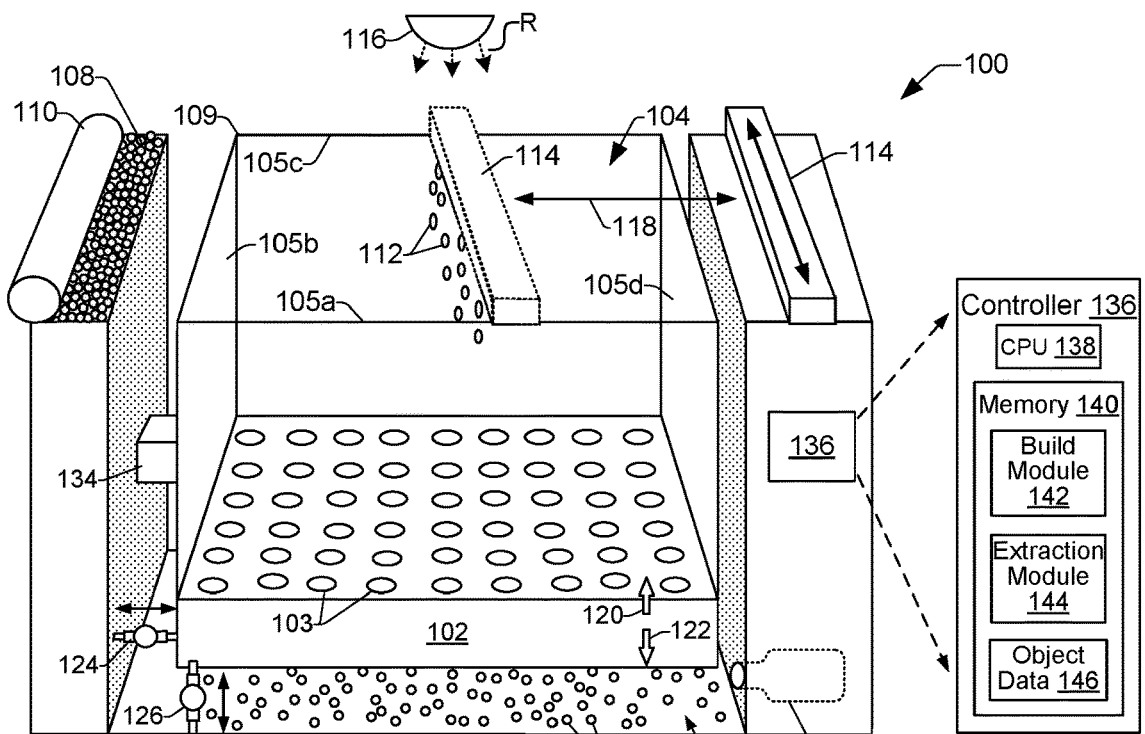
FIG. 1 shows a perspective view of an example extraction system for extracting 3D objects from a powder build cake.

In some examples of 3D printing, after a 3D print job is finished being printed, the result is a build volume comprising a block of heated build material that contains solidified 3D objects within the block. Such blocks of build material can be produced, for example, with powder-based printing systems that implement a layer-by-layer accumulation and solidification of powdered build material. The build material used to print 3D objects in such layer-by-layer 3D printing processes can include various powdered materials such as polystyrene, ceramics, glass, nylon, and metals including steel, titanium, aluminum, and silver. A block of build material containing a 3D object may therefore be alternately referred to herein as a "cake", a "powder cake", a "build cake", a "powdered build cake", and the like.

The strength or firmness of the powder cake surrounding the 3D object can depend on various factors associated with the particular printing process used to generate the cake. Such factors can include, for example, the type of powdered build material used, the amount of preheat applied to the layers of build material, the amount of heat applied to melt selected regions of build material layers, and so on. Thus, in different examples, in addition to a fully fused and solidified 3D object, the cake may comprise a continuum of build material that ranges in firmness from loosely bound powder to weakly fused powder. In some examples, the cake may comprise more firmly fused powder in areas closer to the 3D object that have been exposed to higher levels of heat during printing.

Accordingly, after a printing process is completed, extracting 3D objects from the heated powder cake can involve a number of post printing steps. For example, an initial post printing step can include allowing time for the heated cake to cool off before extracting the objects. In some examples, the cake can be removed from the printing system and placed in a cool environment to help speed the cooling. If the cake comprises loosely bound powder, a next step in extracting a 3D object can include digging into the loose powder and carefully removing the object by hand. However, in some examples where the cake comprises partially fused powder, a next step can include physically fracturing the cake to help the cake cool faster and to break pieces of the cake away from the 3D object or objects. Other post printing steps can include cleaning the 3D objects using pressurized air to remove the remaining fine powder, polishing surfaces of the objects, applying a coating to the surfaces of the objects, and so on.

These and other post printing processes can involve significant human interaction with the powder cake. For example, prior to breaking apart a cake comprising partially fused powder, the cake can be physically removed from the 3D printing device and relocated to a setting that is conducive to applying mechanisms to the cake that can cause the cake to break apart. Such mechanisms have generally included various types of hand held instruments such as hammers, trowels, brushes, and so on. These and other instruments can be used to further break up the cake into smaller and smaller pieces so that the powder can be cleared away from the 3D object or objects. Such post printing processes can add significant time, labor, and cost to the creation of 3D printed parts.

Accordingly, examples of systems and methods for extracting three-dimensional (3D) objects are described herein that enable automated extraction of 3D objects from powdered build cakes created in 3D printing devices. In some examples, a system employs a vibratory extraction platform that can vibrate a powder build cake, creating stress points within the cake that help to fracture the cake. In some examples the extraction platform comprises a sieve surface that can grate through the cake as the platform vibrates. The sieve platform can mechanically shear small pieces of the cake away and sift the small pieces of powdered build material through the platform. In different examples, the cake can either be transferred to the vibratory extraction platform from a 3D printing system, or it can be formed on the vibratory extraction platform within a 3D printing system. In some examples, a system employs an impulse mechanism that can apply an impulse to a powder cake, and/or to a container holding the powder cake, in order to create cracks in the cake. The impulse creates a high shock or g-force through the cake through an impact mechanism such as a linear motor, a solenoid, or a geared release system.

In some examples, a system for extracting a 3D object can comprise an independent system that stands alone and receives a powder build cake transferred from a 3D printing device for post print processing. In some examples, a system for extracting a 3D object can comprise an integral part of a 3D printing system in which a powder build cake is formed in the 3D printing system and remains in the 3D printing system for post print processing. In either case, a system for extracting a 3D object enables automation of various extraction steps that can significantly reduce the time and effort involved in extracting 3D objects from powder cakes. For example, cracking a powdered build cake with an impulse, or breaking it apart using a vibratory platform can significantly reduce the time it takes for the cake to cool, which enables a faster extraction of a 3D object from the cake. In some examples, however, because cooler cakes have been shown to crack more readily by impulse than cakes that are still hot, the cake can be allowed to cool prior to applying an impulse in order to improve cracking of the cake. Furthermore, vibrating a powder cake on an extraction platform to shear away powdered build material and sift the material through the platform can reduce the time it takes to extract a 3D part from a cake as well as reduce the effort otherwise involved in retrieving the part.

In a particular example, a method of extracting 3D objects includes forming on a vibratory extraction platform, a build cake that comprises a fused 3D object encased within build material, and vibrating the extraction platform to break apart the build material and sift the material through openings in the extraction platform.

In another example, a system for extracting 3D objects includes a work area to contain a build cake that comprises a fused 3D object encased within powdered build material. The vibratory extraction platform forms a floor to the work area. The system includes a vibration device to vibrate the extraction platform to break apart the build material and sift it through openings in the extraction platform. In some examples, the work area comprises a work area within a 3D printing device where the build cake is formed. In some examples, the work area comprises a work area within an independent extraction system to which the build cake can be transferred.

In another example, a device for extracting 3D objects includes a 3D printing system to form a 3D object on an extraction platform. The 3D object is to be formed within a cake comprising build material. The device also includes a vibration device to vibrate the extraction platform. Vibrating the extraction platform is to break apart the cake and cause build material to sift through openings in the extraction platform.

FIG. 1 shows a perspective view of an example extraction system 100 for extracting 3D objects from a powder build cake. The example extraction system 100 is implemented as a powder-based 3D printing system 100 that forms 3D objects through a process that includes a layer-by-layer accumulation and solidification of powdered build material. Thus, as shown in FIG. 1, the example system 100 can provide a 3D printing function to form a powder build cake comprising a 3D object, in addition to providing an extraction function to extract the 3D object from the powder build cake. The process of forming a build cake can vary depending on the additive manufacturing process being used. Thus, while one example process for producing/printing a 3D object within a build cake is generally described herein, other powder-based processes are possible and contemplated. Such powder-based 3D printing processes can include, for example, selective laser sintering, selective laser melting, and binder jetting. In some examples, an extraction system 100 can be implemented as an independent extraction device that provides an extraction function independent of a 3D printing function. In such examples, the extraction system can receive a powder build cake previously formed in a separate 3D printing device and extract a 3D object from the powder build cake.

Referring to FIG. 1, the example system 100 includes a moveable printing platform 102, or build platform 102, that can serve as a floor to a work space 104 in which a 3D object (not shown in FIG. 1) can be printed. In some examples, the platform comprises a vibratory extraction platform 102 that includes openings 103 discussed herein below. Because the platform 102 can perform multiple functions, the platform 102 may be referred to alternately herein as a printing platform 102, a build platform 102, an extraction platform 102, a vibratory extraction platform 102, a sieve platform 102, and so on.

Figure 2:
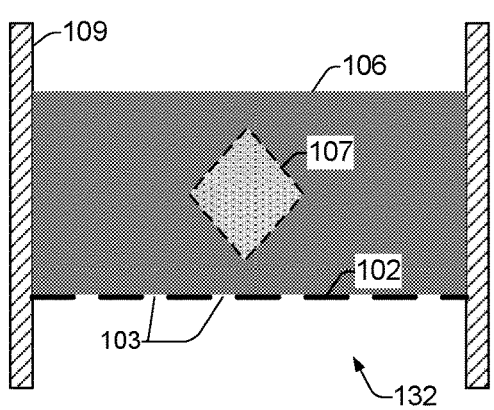
FIG. 2 shows an example of a build cake that has been deposited and processed in a container.

The work space 104 can be located within a build container 109 comprising walls 105 (illustrated as front wall 105a (shown as transparent), side wall 105b, back wall 105c, side wall 105d), where the build platform 102, or vibratory extraction platform 102, serves as a floor to the build container 109. In some examples, the extraction platform 102 can be rigidly attached to the walls 105 of the build container 109 such that when the extraction platform 102 is vibrated, the entire build container 109 vibrates. In other examples, the extraction platform 102 may not be attached to the walls 105 of the build container 109. As shown in FIG. 2, the build container 109 and platform 102 can contain a volume 106 of powdered build material that has been deposited into the work space 104 and heated in a layer by layer 3D print process during printing of a 3D object 107. The volume of powdered build material can be referred to alternately as a "cake" 106, a "powder cake" 106, a "build cake" 106, a "powdered build cake" 106, and the like.

FIG. 2 shows an example of a build cake 106 that has been formed in a layer by layer process within a build container 109. The build cake 106 is shown resting on a vibratory extraction platform 102. In some examples, the vibratory extraction platform 102 can comprise an integral part of a 3D printing system 100 as shown in FIG. 1. In such examples, the vibratory extraction platform 102 comprises a build platform 102 on which the build cake 106 is formed. In other examples, the vibratory extraction platform 102 can comprise part of an independent extraction system for extracting 3D objects from a powder build cake 106. In such examples, a build cake 106 is not formed on the extraction platform 102, but can instead be transferred to the extraction platform to extract a 3D object from the build cake 106.

Referring generally to FIGS. 1 and 2, a build cake 106 can be formed within the work space 104 of build container 109. The build cake 106 can include a 3D object 107 shown with dashed lines in FIG. 2 to indicate its location within the volume of the build cake 106. A 3D object 107 can be formed by layers of powdered build material 108 that have each been spread over the platform 102 by a material spreader 110 (e.g., a roller, a blade, etc.), and subsequently processed by depositing a liquid fusing agent 112 from a liquid agent dispenser 114 and by applying heat from a heat source 116. In some examples a dispenser 114 can be implemented as a print bar comprising multiple drop-on-demand printheads such as thermal inkjet and/or piezoelectric inkjet printheads. In some examples a carriage (not shown) can be associated with the dispenser 114 to convey the dispenser 114 over the platform 102 in a scanning motion (illustrated by direction arrow 118) during the application of liquid agent 112 onto a layer of build powder on the platform 102. Heat source 116 can be implemented as a radiation source 116 to provide fusing energy R (e.g., radiation) to melt selected regions of each layer of build powder. In some examples (not shown), the heat source 116 can also be conveyed across the platform 102 in a scanning motion or some other motion. The finished build cake 106 can include a 3D object 107 encased within and supported by build powder that has been weakly fused together by heat generated during the printing process.

As shown in FIG. 1, the vibratory extraction platform 102 (i.e., build platform 102) is moveable within the work space 104 in an upward and downward direction as indicated by up arrow 120 and down arrow 122, respectively. When printing of a 3D object begins, the platform 102 can be located in an upward position toward the top of the work space 104 as a first layer of powdered build material is deposited onto the platform 102 and processed. Accordingly, during formation of the build cake and 3D object(s), powdered material is applied from a top side of the work space 104 and build container 109. In some examples, multiple layers of powdered build material can be deposited onto the platform 102 as sacrificial layers prior to depositing and processing a first layer of 3D object to be printed. The sacrificial layers can be used to clog up the openings 103 in the platform 102 and create a stable surface on which to begin forming layers to build a 3D object 107. Given that the build material 108 can be powdered material with fine particle sizes, it should be apparent that the openings 103 shown in FIG. 1 are not drawn to scale. In some examples, the openings 103 of a platform 102 can be small enough that when numerous particles land indirectly on and around the openings, they push against one another and prevent the entry of any particles through the openings, thus clogging the openings. After several sacrificial layers have been deposited onto the platform 102, clogging the openings 103 and creating a stable surface, a first layer of a 3D object to be printed can be deposited onto the last sacrificial layer. After a first layer of powder has been processed with a fusing agent and heat as discussed above, the platform 102 can move in a downward direction 122 as additional layers of powdered build material are deposited onto the platform 102 and processed.

As further shown in FIG. 1, the extraction system 100 can include a vibration device, such as vibration devices 124 and 126. The vibration devices can be coupled to the vibratory extraction platform 102 to vibrate the platform 102 in order to break apart build material from the build cake 106 and to sift the broken up build material through the openings 103 in the extraction platform 102. In some examples, a vibration device 124 can be employed to vibrate the extraction platform 102 in a horizontal direction, while a vibration device 126 can be employed to vibrate the extraction platform 102 in a vertical direction. In some examples, the frequency, magnitude, and direction of vibration of the extraction platform 102 can be controlled by controlling the vibration devices 124, 126. A vibration device 124, 126 can be implemented in various ways including, for example, as an eccentric rotating mass vibration motor (ERM) and a linear resonant actuator (LRA).

Figure 3:
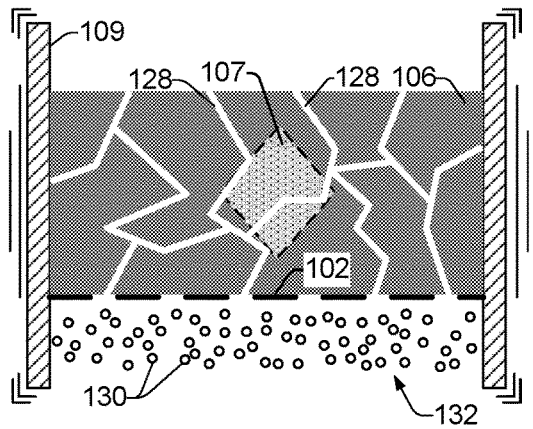
FIG. 3 shows an example of an extraction platform being vibrated to break apart powdered build material from a build cake.

FIG. 3 shows an example of an extraction platform 102 being vibrated to break apart powdered build material from the build cake 106 and to sift the broken up build material through the openings 103 in the extraction platform 102. Thus, while powdered build material can be applied from the top side of the build container 109 during formation of the build cake, as noted above, powdered material can be extracted from the bottom side of the build container 109 (i.e., through the platform 102) during vibration and break-up of the build cake. Vibration of the extraction platform 102 can create stress within the powder build cake 106 that causes the cake 106 to fracture, as indicated by the fracture lines 128 in FIG. 3. In addition to breaking apart build material, fracturing the cake increases the surface area of the cake which can increase the cooling rate of the cake and of 3D objects within the cake.

Figure 4:
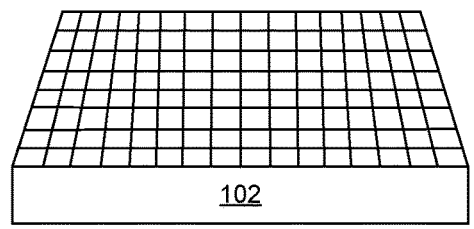
FIG. 4 shows an example of an extraction platform implemented as a screen platform with a course screen grid of crossed wires.

In addition to causing fractures in the cake 106, the vibratory extraction platform 102 can shear away small pieces of the cake and sift the small pieces of loose powdered build material 130 through the openings 103 in the platform 102. The openings 103 in the extraction platform 102 can include a variety of different types of openings that facilitate the break up and/or shearing of the build cake 106 as the platform 102 is being vibrated by vibration devices 124, 126. For example, the extraction platform 102 can comprise a sieve platform with holes as shown generally in FIG. 1, a screen platform with a course screen grid of crossed wires as shown in FIG. 4, a labyrinth platform comprising an irregular network of passages, a grater platform comprising a surface covered with holes having slightly raised cutting edges, and so on.

As shown in FIGS. 1 and 3, an extraction system 100 can also include a particle collection area 132 to collect loose powdered build material 130 that has been broken away from and/or sheared off of the build cake 106. In some examples, the particle collection area 130 can include a particle collection container (not shown) to collect the powdered build material 130 falling from the force of gravity through the openings 103 in the extraction platform 102. In some examples, an extraction system 100 can include a vacuum source 131 positioned, for example, below the extraction platform 102 to increase the rate of extraction of loose powder through the openings 103 and away from the cake 106 and 3D object 107. In addition to pulling loose powder through openings 103, the vacuum 131 can increase cooling of the cake and 3D object by generating air convection through the fracture lines 128. In some cases the powder cake can increase in firmness as it cools over time, which can influence the timing for applying vibration or an impulse into the cake.

In some examples, an extraction system 100 can include an impulse generator 134 to apply an impulse to a powder build cake 106. An impulse generator 134 can be employed to fracture the cake 106 prior to vibrating the cake on the extraction platform 102. In some examples, fracturing the cake 106 can be useful to help speed the cooling of the cake prior to vibration. In some examples, an impulse generator 134 can apply an impulse to the build container 109 that holds the powder build cake 106. An impulse applied to the cake 106 or the build container 109 can impart a high level of g-force to the cake 106 that mechanically shocks the cake and transmits interior mechanical stress throughout the cake 106, causing it to fracture. An impulse generator 134 can be implemented as a variety of different devices including, for example, a linear motor, a solenoid, and a geared-release system.

Referring still to FIG. 1, the example extraction system 100 additionally includes an example controller 136. The controller 136 can control various operations of the extraction system 100 to facilitate both the printing of 3D objects as generally described above, and the extraction of 3D objects from a powder build cake 106 containing 3D objects. As shown in FIG. 1, an example controller 136 can include a processor (CPU) 138 and a memory 140. The controller 136 may additionally include other electronics (not shown) for communicating with and controlling various components of the extraction system 100. Such other electronics can include, for example, discrete electronic components and/or an ASIC (application specific integrated circuit). Memory 140 can include both volatile (i.e., RAM) and nonvolatile memory components (e.g., ROM, hard disk, optical disc, CD-ROM, magnetic tape, flash memory, etc.). The components of memory 140 can comprise non-transitory, machine-readable (e.g., computer/processor-readable) media that can provide for the storage of machine-readable coded program instructions, data structures, program instruction modules, JDF (job definition format), 3MF formatted data, and other data and/or instructions executable by a processor 138 of the extraction system 100.

An example of executable instructions to be stored in memory 140 include instructions associated with a build module 142 and an extraction module 144, while examples of stored data can include object data 146. In general, modules 142 and 144 include programming instructions executable by processor 138 to cause the extraction system 100 to perform operations related to printing 3D objects within a work space 104, and extracting the 3D objects from a powder build cake 106 generated in the printing process. Such operations can include, for example, the operations of a method 500, described below with respect to FIG. 5.

In some examples, controller 136 can receive object data 146 from a host system such as a computer. Object data 146 can represent, for example, object files defining 3D object models to be produced in the extraction system 100. Executing instructions from the build module 146, the processor 138 can generate print data for each cross-sectional slice of a 3D object model from the object data 146. The print data can define, for example, each cross-sectional slice of a 3D object model, the liquid agents to be used to cover the build powder within each cross-sectional slice, and how fusing energy is to be applied to fuse each layer of powder build material. The processor 138 can use the print data to control printing components of the extraction system 100 to process each layer of build powder. Thus, the object data can be used to generate commands and/or command parameters for controlling the distribution of build powder 108 onto the extraction platform 102 by a spreader 110, the application of fusing agents 112 by a print bar 114 onto layers of the powder, the application of radiation by a radiation source 116 to the layers of powder, and so on.

The extraction module 144 includes further executable instructions to enable a processor 138 to control the extraction system 100 to perform an extraction of a 3D object 107 from a build cake 106 generated during a printing process. More specifically, extraction module instructions can execute to control vibration devices 124 and 126 to vibrate the vibratory extraction platform 102 in order to break apart build material from the build cake 106 and to sift the broken up build material through the openings 103 in the extraction platform 102. The vibration devices 124 and 126 can be controlled to vibrate the extraction platform 102 in horizontal and vertical directions. The frequency, magnitude, and direction of vibration of the extraction platform 102 can also be controlled by controlling the vibration devices 124, 126.

The extraction module instructions can also execute to enable a processor 138 to control an impulse generator 134 to apply an impulse to a powder build cake 106 (or the build container 109 containing the cake 106) to fracture the cake 106 prior to vibrating the extraction platform 102. The impulse generator 134 can be controlled to apply varying levels of impulses to the cake 106 that can impart varying levels of g-force to the cake 106 that mechanically shock the cake and transmit interior mechanical stress through the cake 106, causing it to fracture. The extraction module instructions can execute to determine different levels of impulses based on factors such as the type of powder build material of the cake 106, the temperature of the cake 106, the size and shape of the 3D objects contained within the cake 106, and so on.

Figure 5:
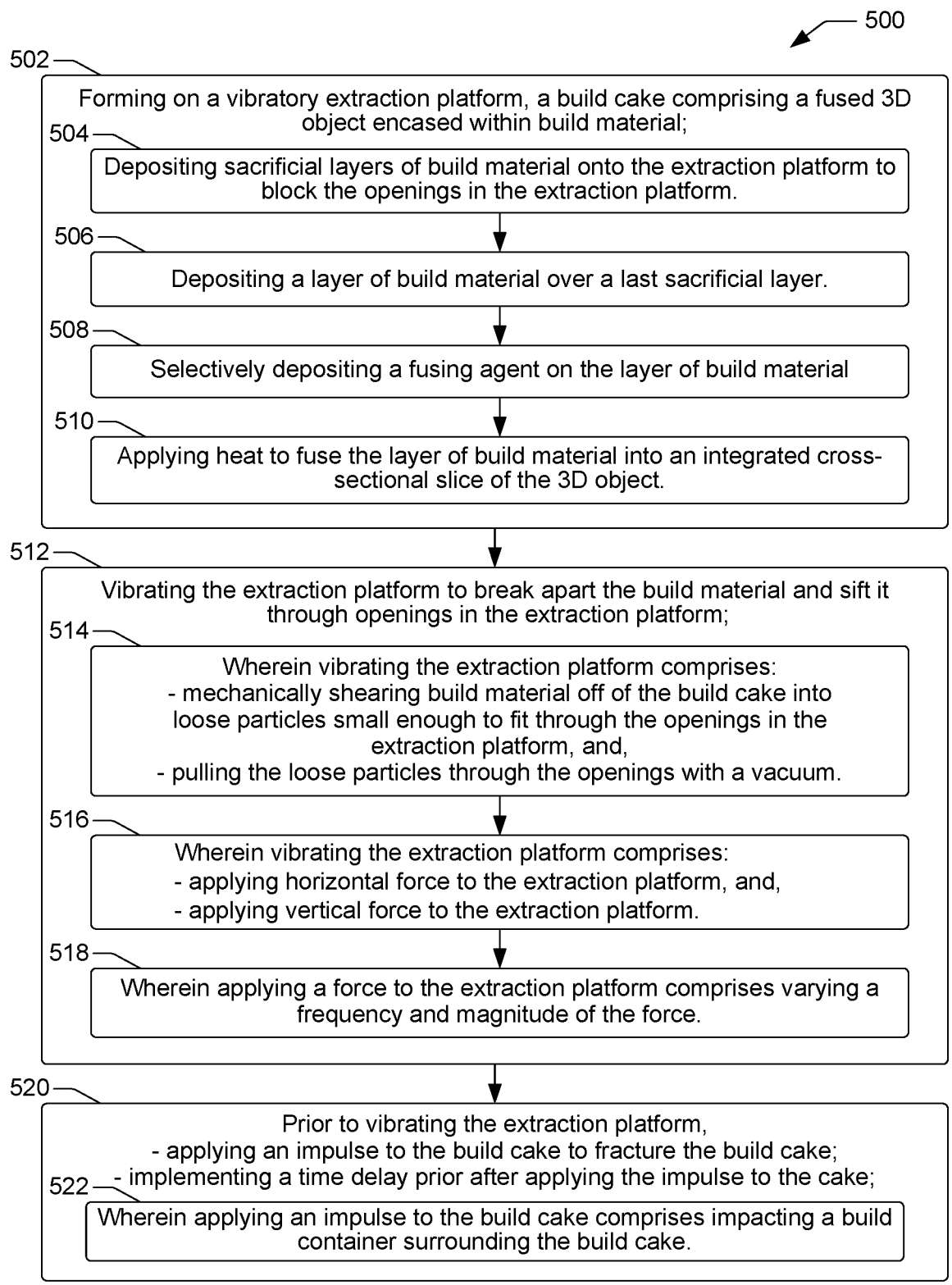
FIG. 5 shows a flow diagram of an example method of extracting 3D objects.

FIG. 5 shows a flow diagram of an example method 500 of extracting 3D objects. The method 500 is associated with examples discussed above with regard to FIGS. 1-4, and details of the operations shown in method 500 can be found in the related discussion of such examples. The operations of method 500 may be embodied as programming instructions stored on a non-transitory, machine-readable (e.g., computer/processor-readable) medium, such as memory 140 shown in FIG. 1. In some examples, implementing the operations of method 500 can be achieved by a processor, such as a processor 138 of FIG. 1, reading and executing the programming instructions stored in a memory 140. In some examples, implementing the operations of method 500 can be achieved using an ASIC and/or other hardware components alone or in combination with programming instructions executable by a processor 138.

The method 500 may include more than one implementation, and different implementations of method 500 may not employ every operation presented in the flow diagram of FIG. 5. Therefore, while the operations of method 500 are presented in a particular order within the flow diagram, the order of their presentation is not intended to be a limitation as to the order in which the operations may actually be implemented, or as to whether all of the operations may be implemented. For example, one implementation of method 500 might be achieved through the performance of a number of initial operations, without performing one or more subsequent operations, while another implementation of method 500 might be achieved through the performance of all of the operations.

Referring now to the flow diagram of FIG. 5, an example method 500 of extracting 3D objects begins at block 502 with forming on a vibratory extraction platform, a build cake comprising a fused 3D object encased within build material. In some examples as shown at blocks 504, 506, 508, and 510, respectively, forming a build cake on a vibratory extraction platform can include depositing sacrificial layers of build material onto the extraction platform to block the openings in the extraction platform, depositing a layer of build material over a last sacrificial layer, selectively depositing a fusing agent on the layer of build material, and applying heat to fuse the layer of build material into an integrated cross-sectional slice of the 3D object.

The method 500 can continue as shown at block 512 with vibrating the extraction platform to break apart the build material and sift it through openings in the extraction platform. In some examples, as shown at block 514, vibrating the extraction platform can include mechanically shearing build material off of the build cake into loose particles small enough to fit through the openings in the extraction platform, and pulling the loose particles through the openings with a vacuum. As shown at block 516, in some examples vibrating the extraction platform can include applying horizontal and vertical force to the extraction platform. In some examples, applying a force to the extraction platform can include varying the frequency and magnitude of the force, as shown at block 518.

In some examples, method 500 can include, applying an impulse to the build cake to fracture the build cake prior to vibrating the extraction platform, as shown at block 520. In some examples, a time delay can be implemented after applying an impulse, prior to vibrating the extraction platform. Such a delay can be useful, for example, to speed the cooling of the cake prior to vibration. In some examples, applying an impulse to the build cake can include impacting the build container surrounding the build cake, as shown at block 522.

What is claimed is:

1. A three-dimensional (3D) printing system to form and extract 3D objects comprising:

a build container in which to form and contain a build cake comprising a fused 3D object encased within powdered build material;

a vibratory build and extraction platform that forms a movable floor within the build container on which to form the build cake;

a build material spreader to distribute powdered build material layers onto the platform;

a liquid agent dispenser to dispense a fusing agent onto portions of the layers;

a heat source to apply heat to the layers;

a vibration device coupled to the platform to vibrate the platform within the 3D printing system and cause the powdered build material encasing the 3D object to break apart and sift through openings in the platform; and, an impulse mechanism distinct from the vibration device and coupled to the build container to apply an impulse to the build container within the 3D printing system to fracture the build cake prior to vibrating the platform.

2. A system as in claim 1, further comprising:
a controller programmed to control a frequency, a magnitude, and a direction of vibration of the platform.

3. A system as in claim 1, wherein:
the build material spreader is positioned at a top side of the build container to distribute the layers of build material onto the platform;

the liquid agent dispenser is conveyable in a scanning motion over the platform to selectively dispense a fusing agent onto portions of the layers of build material; and, the heat source is positioned above the platform to apply heat to the layers of build material.

4. A system as in claim 1, wherein the platform is selected from the group consisting of a sieve platform comprising holes, a screen platform comprising a screen grid of crossed wires, a labyrinth platform comprising an irregular network of passages, a grater platform comprising holes having raised cutting edges.

5. A system as in claim 1, wherein the vibration device is a device selected from the group consisting of an eccentric rotating mass vibration motor (ERM) and a linear resonant actuator (LRA).

6. A system as in claim 1, further comprising:
a particle collection area positioned below the platform to collect build material that falls through the openings in the platform.

7. A system as in claim 6, further comprising:
a vacuum source positioned below the platform to increase a rate that the build material falls through the openings in the platform.

* * * * *